United States Patent
Chen et al.

(10) Patent No.: US 10,598,693 B2
(45) Date of Patent: Mar. 24, 2020

(54) TEST SOCKET FOR A CHIP

(71) Applicant: UNIVERSAL SCIENTIFIC INDUSTRIAL (SHANGHAI) CO., LTD., Shanghai (CN)

(72) Inventors: Yu-Hsin Chen, Shanghai (CN); Ho-Chu Kao, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 391 days.

(21) Appl. No.: 15/599,382

(22) Filed: May 18, 2017

(65) Prior Publication Data
US 2018/0299483 A1    Oct. 18, 2018

(30) Foreign Application Priority Data
Apr. 12, 2017   (CN) .......................... 2017 1 0237925

(51) Int. Cl.
    *G01R 1/04*    (2006.01)
(52) U.S. Cl.
    CPC ......... *G01R 1/0466* (2013.01); *G01R 1/0441* (2013.01)
(58) Field of Classification Search
    CPC ...... G01R 1/04; G01R 1/0408; G01R 1/0433; G01R 1/0466; G01R 1/0441; G01R 1/0483
    See application file for complete search history.

(56) References Cited

U.S. PATENT DOCUMENTS

| 6,710,612 B2 | 3/2004 | Farnworth et al. |
| 2003/0171021 A1* | 9/2003 | Okamoto ............. G01R 1/0466 439/331 |
| 2007/0285106 A1* | 12/2007 | Henry ................. G01R 1/0408 324/555 |

FOREIGN PATENT DOCUMENTS

| TW | M246594 | 10/2004 |
| TW | I375291 B | 10/2012 |
| TW | M485408 | 9/2014 |

* cited by examiner

*Primary Examiner* — Son T Le
(74) *Attorney, Agent, or Firm* — Foley & Lardner LLP

(57) ABSTRACT

The present disclosure relates to a test socket for a chip, which comprises: a recess for receiving the chip and two push mechanisms. The recess is surrounded by four sections. The two push mechanisms are respectively arranged at two adjacent sections. Each of the two push mechanisms comprises: a push button, wherein a bottom of the push button is connected to a vertical elastic member; a pusher cooperated with the push button, wherein one end of the pusher extends into the recess and the opposite end of the pusher is connected to a lateral elastic member. When the push button is upwardly pushed by the vertical elastic member, a top of the push button protrudes from a top surface of the section and the pusher will be engaged with the push button. When the push button is pressed and moves downwardly, the lateral elastic member pushes the pusher to move toward the recess.

15 Claims, 4 Drawing Sheets

TEST SOCKET FOR A CHIP

CROSS-REFERENCE TO RELATED PATENT APPLICATIONS

This application claims the benefit of and priority to Chinese Patent Application Number 201710237925.1 filed on Apr. 12, 2017, the contents of which are incorporated herein by reference in their entirety.

BACKGROUND

Technical Field

The instant disclosure relates to a test socket for a chip, more particularly, to an apparatus for aligning a chip to be inspected.

Description of Related Art

A conventional test socket for a chip needs two pushers at the same horizontal plane which are respectively driven by two pneumatic cylinders. When the chip is disposed within the test socket, the two pneumatic cylinders will respectively drive the two pushers such that the two pushers push the chip to move in an X-axis direction and a Y-axis direction until the chip is correctly positioned.

However, since the pushers are driven by the pneumatic cylinders, the conventional test socket needs a larger space for receiving the pneumatic cylinders. Thus, the size of the conventional test socket should be large.

SUMMARY

According to one exemplary embodiment of the instant disclosure, a test socket for a chip comprises a recess for receiving the chip, a first push mechanism, and a second push mechanism. The recess is surrounded by a first section, a second section, a third section and a fourth section, wherein the first section is connected to the second section and the fourth section and the third section is connected to the second section and the fourth section.

The first push mechanism is arranged at the first section and comprises a first push button, a first vertical elastic member, a first pusher and a first lateral elastic member. The first push button has a first protrusion at its top. The first vertical elastic member is connected to a bottom of the first push button. The first pusher is cooperated with the first push button, wherein the first pusher has a first pushing end extending into the recess. The first lateral elastic member is connected to a first abutment end of the first pusher, wherein the first abutment end is opposite the first pushing end.

When no force is applied to the first push button, the first vertical elastic member upwardly pushes the first push button such that the first protrusion protrudes from a top surface of the first section and the first push button engages with the first pusher such that the first pusher cannot be pushed by the first lateral elastic member. When the first protrusion of the first push button is pressed, the first push button moves downwardly and the first lateral elastic member pushes the first pusher to move toward the recess.

The second push mechanism is arranged at the second section and comprises: a second push button, a second vertical elastic member, a second pusher and a second lateral elastic member. The second push button has a second protrusion at its top. The second vertical elastic member is connected to a bottom of the second push button. The second pusher is cooperated with the second push button, wherein the second pusher has a second pushing end extending into the recess. The second lateral elastic member is connected to a second abutment end of the second pusher, wherein the second abutment end is opposite the second pushing end.

When no force is applied to the second push button, the second vertical elastic member upwardly pushes the second push button such that the second protrusion protrudes from a top surface of the second section and the second push button engages with the second pusher such that the second pusher cannot be pushed by the second lateral elastic member. When the second protrusion of the second push button is pressed, the second push button moves downwardly and the second lateral elastic member pushes the second pusher to move toward the recess.

According to another exemplary embodiment of the instant disclosure, a test socket for a chip comprises a recess for receiving the chip and two push mechanisms. The recess is surrounded by four sections. The two push mechanisms are respectively arranged at two adjacent sections. Each of the two push mechanisms comprises: a push button and a pusher cooperated with the push button, wherein a bottom of the push button is connected to a vertical elastic member and wherein one end of the pusher extends into the recess, and the opposite end of the pusher is connected to a lateral elastic member. When the push button is upwardly pushed by the vertical elastic member, a top of the push button protrudes from a top surface of the section and the pusher will be engaged with the push button. When the push button is pressed and moves downwardly, the lateral elastic member pushes the pusher to move toward the recess.

In order to further understand the instant disclosure, the following embodiments are provided along with illustrations to facilitate the appreciation of the instant disclosure; however, the appended drawings are merely provided for reference and illustration and are not intended to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
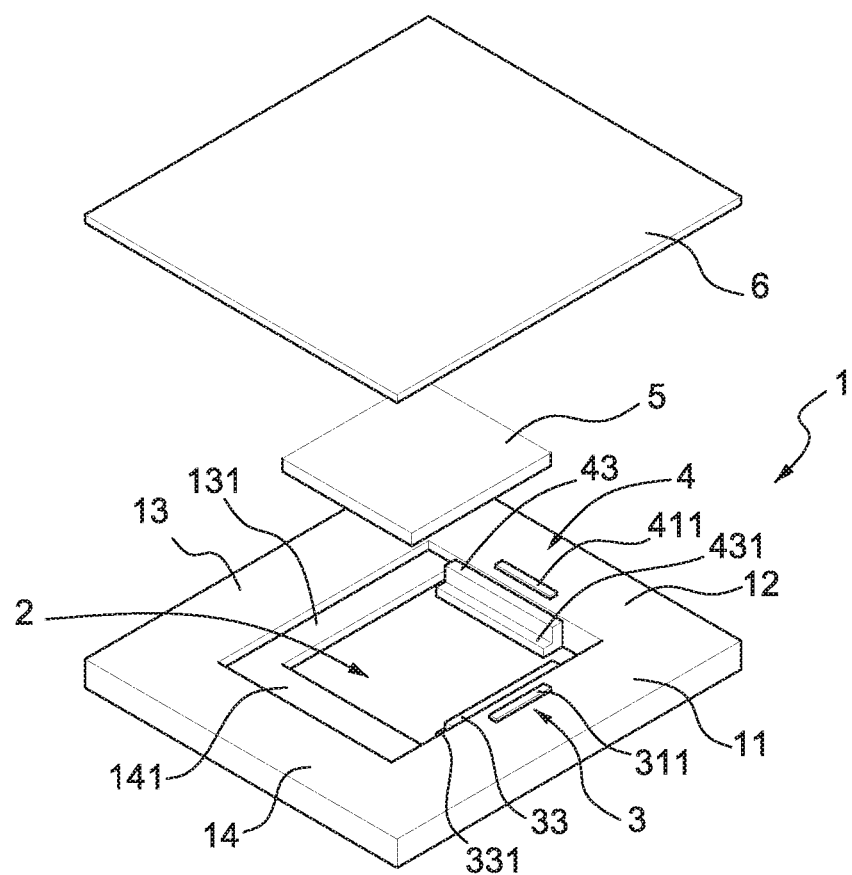
FIG. 1A is a perspective schematic view of a test socket as well as a chip and a pressing device in accordance with an embodiment of the instant disclosure.

FIG. 1A is a perspective schematic view of a test socket 1 as well as a chip 5 and a pressing device 6 in accordance with an embodiment of the instant disclosure. The test socket 1 comprises a recess 2 for receiving a chip 5, a first push mechanism 3, a second push mechanism 4, and a pressing device 6.

As shown in FIG. 1A, the recess 2 is surrounded by four sections, which are the first section 11, the second section 12, the third section 13 and the fourth section 14. The first section 11 is connected to its adjacent sections, such as the second section 12 and the fourth section 14. Likewise, the third section 13 is connected to its adjacent sections, such as the second section 12 and the fourth section 14. The recess 2 is used for receiving the chip 5. A plurality of the probes 15 (referring to FIGS. 2B, 2C, 3B and 3C) used for testing the chip 5 is disposed within the recess 2. When the chip 5 is received within the recess 2 and placed at the appropriate position, the probes 15 will electrically contact with the terminals 51 of the chip 5 and test the chip 5 (referring to FIG. 3B). Further, in order to easily place the chip 5 into the recess 2 and prevent the chip 5 from being scratched by the sections of the recess 2, the size of the recess 2 should be larger than that of the chip 5.

The recess 2 further comprises a first positioning member 131 and a second positioning member 141. The first positioning member 131 is arranged within in the recess 2 and against the third section 13. The second positioning member 141 is arranged within the recess 2 and against the fourth section 14. The first positioning member 131 and the second positioning member 141 are connected to each other so as to be L-shaped. The first positioning member 131 and the second positioning member 141 are used to provide an appropriate position for the chip 5. When the chip 5 is received in the recess 2 and contacts with the first positioning member 131 and the second positioning member 141 simultaneously, the chip 5 is located at the appropriate position for testing.

Figure 1B:
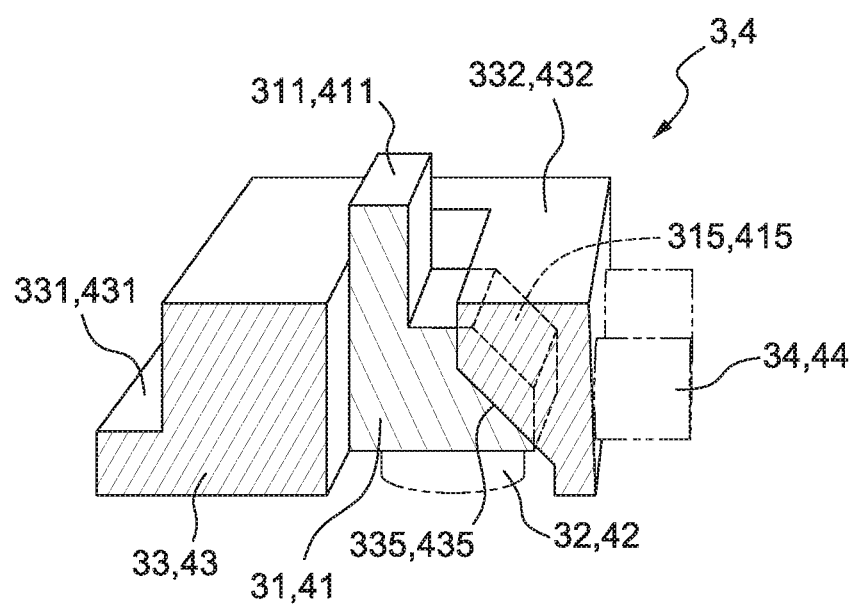
FIG. 1B is a perspective sectional schematic view of a push mechanism.

As shown in FIG. 1A, the first push mechanism 3 is arranged at the first section 11 and the second push mechanism 4 is arranged at the second section 12. Precisely, the first push mechanism 3 is substantially arranged within the interior of the first section 11 and the second push mechanism 4 is substantially arranged within the interior of the second section 12. FIG. 1B is a perspective sectional schematic view of a push mechanism. Referring to FIG. 1B, the first push mechanism 3 comprises a first push button 31, a first vertical elastic member 32, a first pusher 33 and a first lateral elastic member 34. The first push button 31 has a first protrusion 311 at its top and a first wedge surface 315. The first pusher 33 has a first pushing end 331 that will contact with the chip 5, and has a first abutment end 332 with a first wedge surface 335 that abuts against the first wedge surface 315 of the first push button 31. The first abutment end 332 is opposite the first pushing end 331. The first vertical elastic member 32 is connected to the bottom of the first push button 31, which can push the first push button 31 upwardly. In an embodiment of the instant disclosure, the first vertical elastic member 32 can be a spring but is not limited to the aforementioned spring. Further, the quantity of the first vertical elastic member 32 is not limited to one spring. That is to say, the quantity of the first vertical elastic member 32 can be two or even more springs. The first lateral elastic member 34 is connected to the first abutment end 332 of the first pusher 33, which can push the first pusher 33 toward the recess 2. In an embodiment of the instant disclosure, the first lateral elastic member 34 can be a spring but is not limited to the aforementioned spring. Further, the quantity of the first lateral elastic member 34 is not limited to one spring. That is to say, the quantity of the first lateral elastic member 34 can be two or even more springs. Likewise, the structure of the second push mechanism 4 can be identical to that of the first push mechanism 3. Referring to FIG. 1B again, the second push mechanism 4 comprises a second push button 41, a second vertical elastic member 42, a second pusher 43, and a second lateral elastic member 44. The second push button 41 has a second protrusion 411 at its top and a second wedge surface 415. The second pusher 43 has a second pushing end 431 that will contact with the chip 5, and has a second abutment end 432 with a second wedge surface 435 that abuts against the second wedge surface 415 of the second push button 41. The second abutment end 432 is opposite the second pushing end 431. The second vertical elastic member 42 is connected to the bottom of the second push button 41, which can push the second push button 41 upwardly. In an embodiment of the instant disclosure, the second vertical elastic member 42 can be a spring but is not limited to the aforementioned spring. Further, the quantity of the second vertical elastic member 42 is not limited to one spring. That is to say, the quantity of the second vertical elastic member 42 can be two or even more springs. The second lateral elastic member 44 is connected to the second abutment end 432 of the second pusher 43, which can push the second pusher 43 toward the recess 2. In an embodiment of the instant disclosure, the second lateral elastic member 44 can be a spring but is not limited to the aforementioned spring. Further, the quantity of the second lateral elastic member 44 is not limited to one spring. That is to say, the quantity of the second lateral elastic member 44 can be two or even more springs.

Referring to FIG. 1A, the pressing device 6 is arranged above the test socket 1 and used to drive the first push mechanism 3 and the second push mechanism 4. When the pressing device 6 moves downwardly and presses the first protrusion 311 of the first push mechanism 3 and the second protrusion 411 of the second push mechanism 4, the first push mechanism 3 and the second push mechanism 4 are driven to push the chip 5 received in the recess 2 to move to the appropriate position.

Figure 2A:
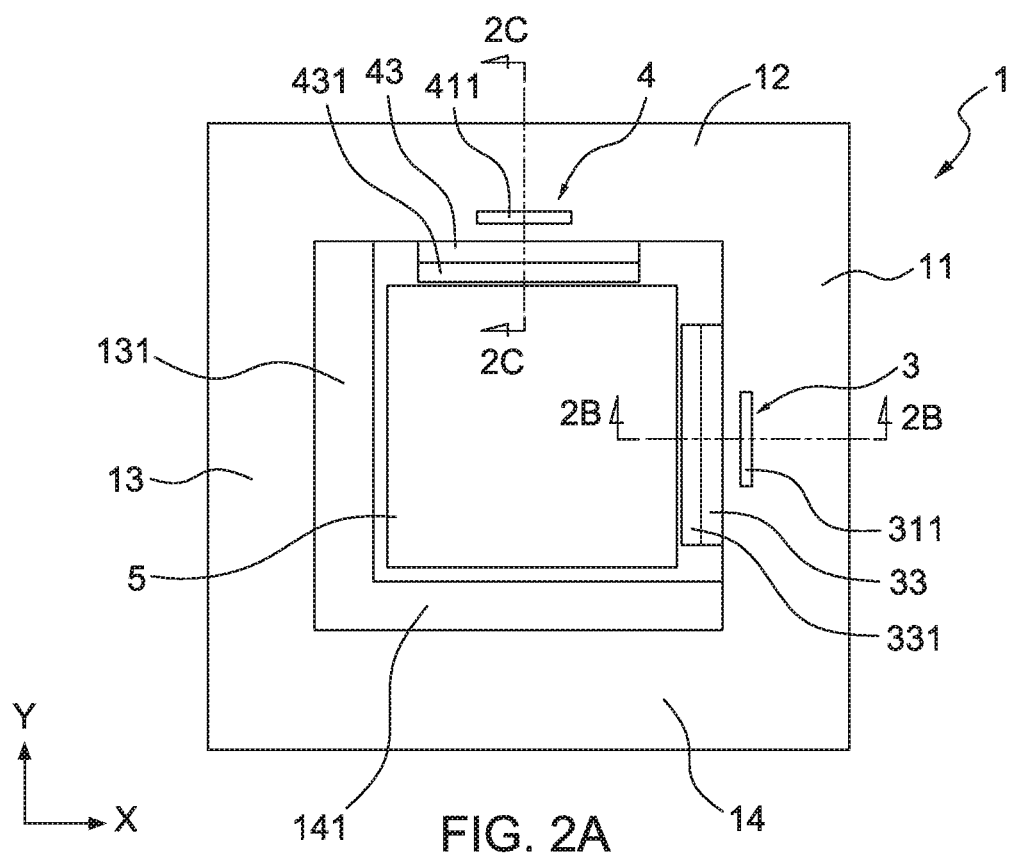
FIG. 2A is a top schematic view of a test socket wherein the chip is in non-positioning status.
Figure 2B:
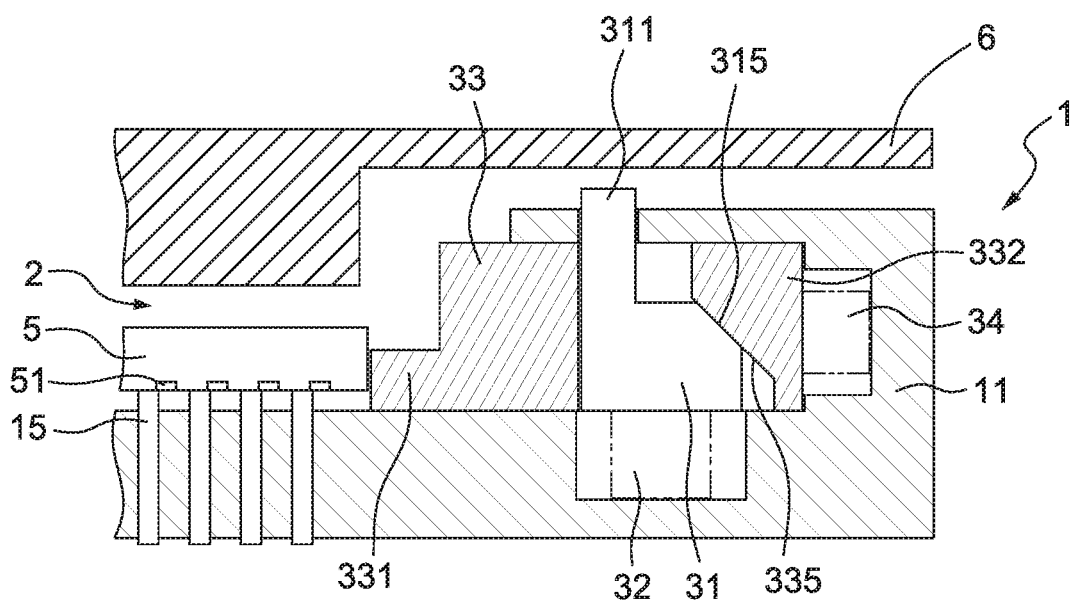
FIG. 2B is a cross-sectional view along 2B-2B in FIG. 2A.
Figure 2C:
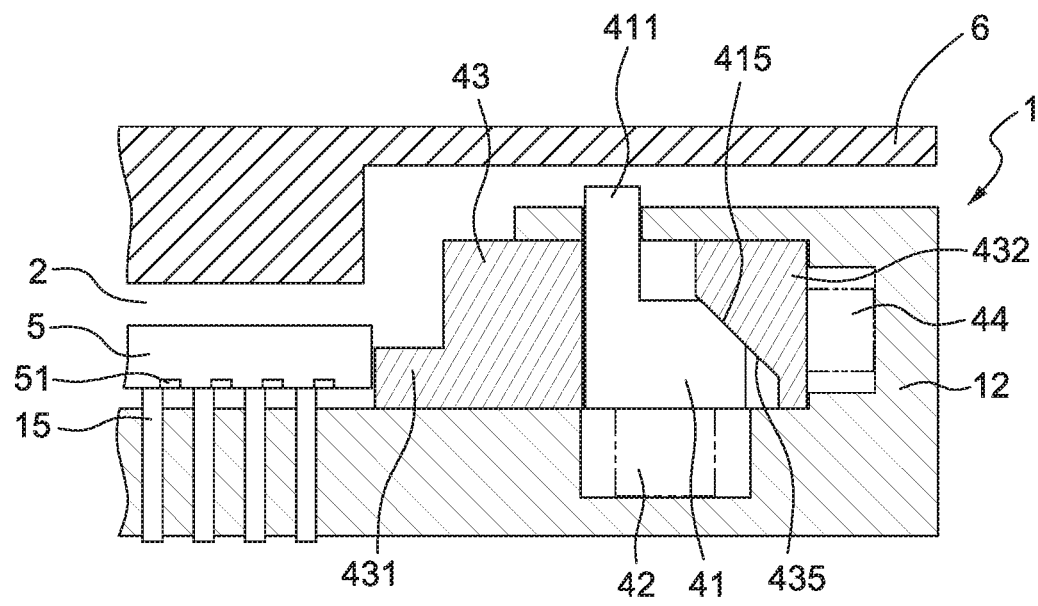
FIG. 2C is a cross-sectional view along 2C-2C in FIG. 2A.

FIG. 2A is a top schematic view of a test socket 1 wherein the chip 5 is in non-positioning status, and FIG. 2B is a cross-sectional view along 2B-2B in FIG. 2A and FIG. 2C is a cross-sectional view along 2C-2C in FIG. 2A. Referring to FIGS. 2A, 2B and 2C, the chip 5 is received in the recess 2 of the test socket 1 but is not located at the appropriate position. That is, the chip 5 does not contact with the first positioning member 131 and the second positioning member 141 simultaneously. Meanwhile, the probes 15 are not aligned with the terminals 51 of the chip 5, and thus the probes 15 do not electrically contact with the terminal 51 of the chip 5.

Further, referring to FIG. 2B, it shows that the chip 5 is not located at the appropriate position and that the pressing device 6 does not move downwardly to press the first protrusion 311 of the first push mechanism 3. As shown in FIG. 2B, the first push button 31 is substantially arranged within the interior of the first section 11. The first vertical elastic member 32 upwardly pushes the first push button 31 such that the first protrusion 311 of the first push button 31 protrudes from the top of the first section 11. The first pusher 33 is substantially arranged within the interior of the first section 11 as well. The first abutment end 332 of the first pusher 33 is connected to the first lateral elastic member 34, and the first pushing end 331 of the first pusher 33 extends into the recess 2. The first wedge surface 315 of the first push button 31 engages with the first wedge surface 335 of the first pusher 33 such that the first push button 31 is propped against the first pusher 33, and the first pusher 33 will not be pushed by the first lateral elastic member 34.

Likewise, as shown in FIG. 2C, the second push button 41 and the second pusher 43 are substantially arranged within the interior of the second section 41. When the pressing device 6 does not move downwardly to press the second protrusion 411 of the second push mechanism 4, the second vertical elastic member 42 upwardly pushes the second push button 41 such that the second protrusion 411 of the second push button 41 protrudes from the top of the second section 12. Further, the second abutment end 432 of the second pusher 43 is connected to the second lateral elastic member 44 and the second pushing end 431 of the second pusher 43 extends into the recess 2. When the pressing device 6 does not move downwardly to press the second protrusion 411 of the second push mechanism 4, the second wedge surface 415 of the second push button 41 engages with the second wedge surface 435 of the second pusher 43 such that the second push button 41 is propped against the second pusher 43, and the second pusher 43 will not be pushed by the second lateral elastic member 44.

Figure 3A:
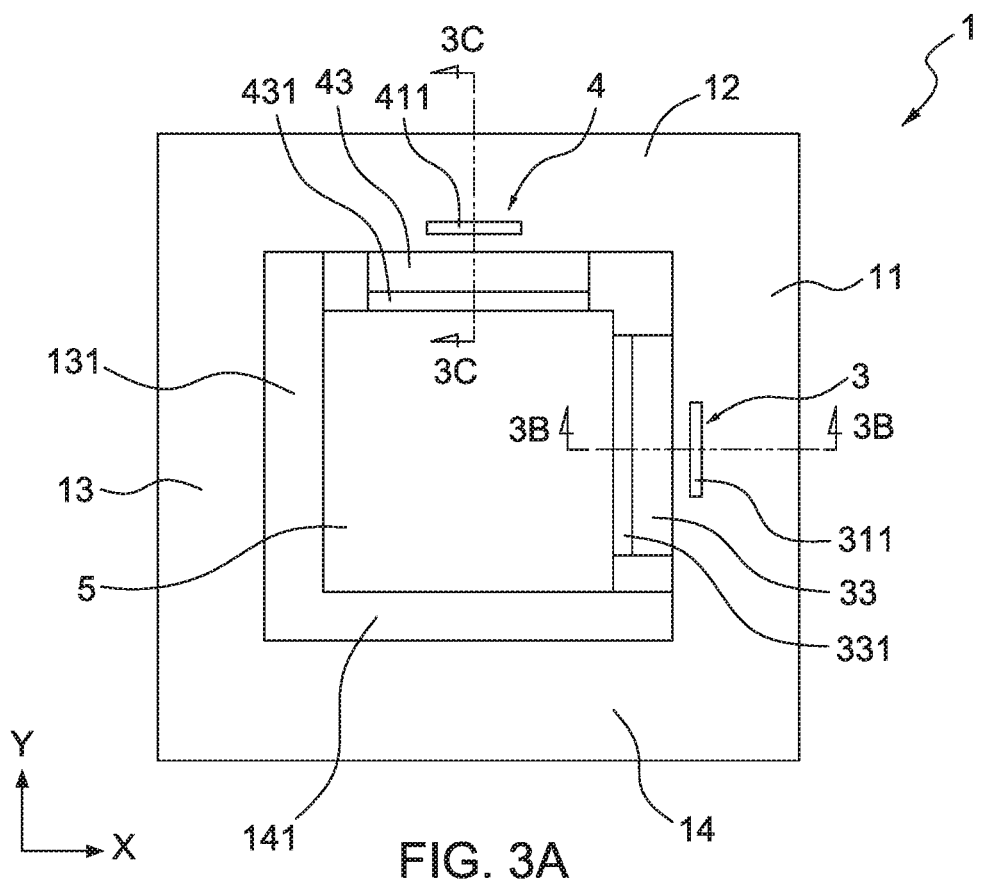
FIG. 3A is a top schematic view of a test socket wherein the chip is in positioning status.
Figure 3B:
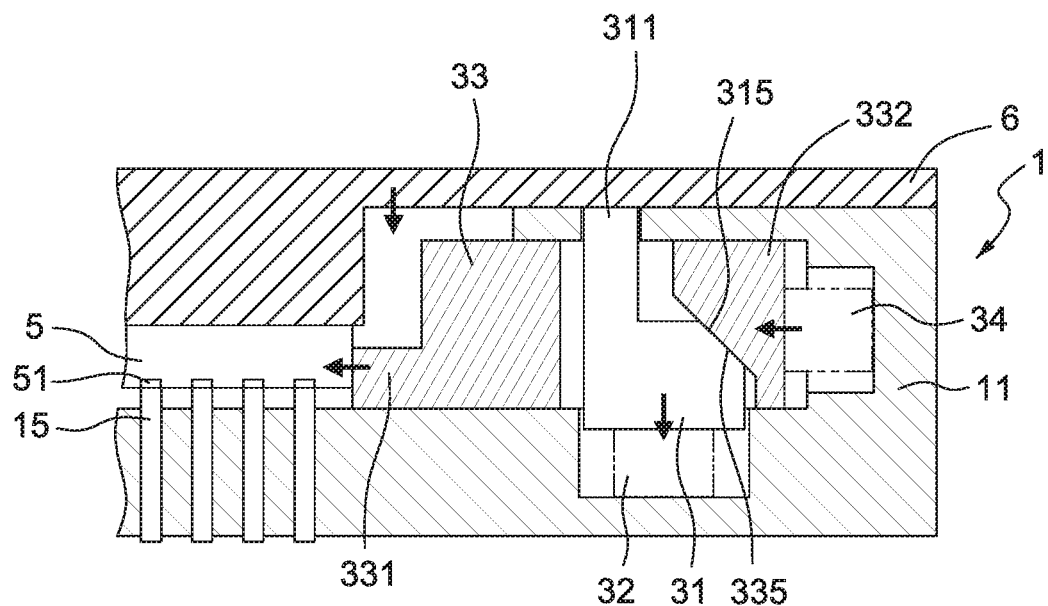
FIG. 3B is a cross-sectional view along 3B-3B in FIG. 3A.
Figure 3C:
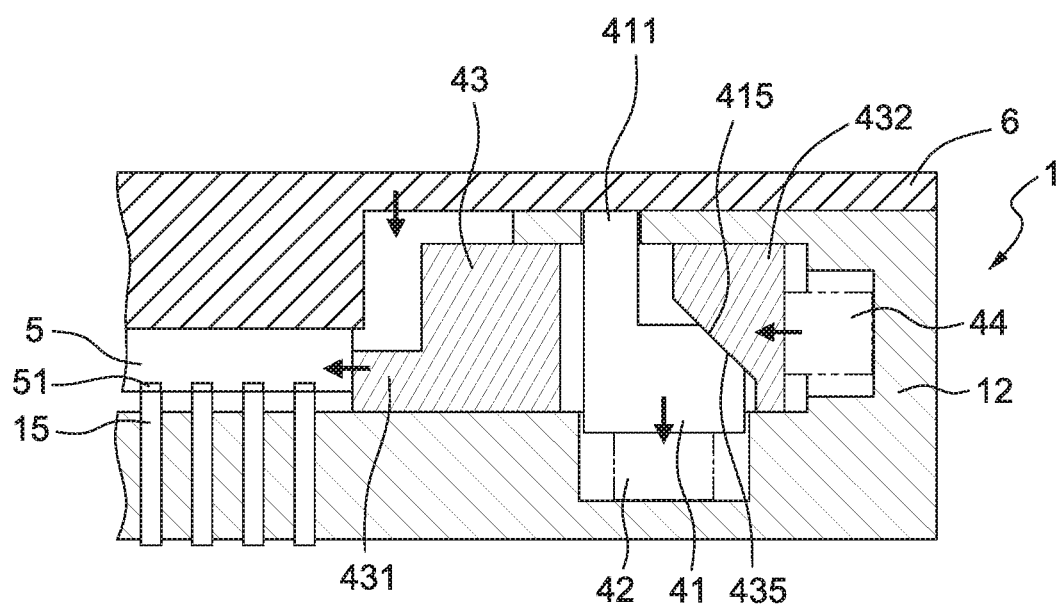
FIG. 3C is a cross sectional view along 3C-3C in FIG. 3A.

FIG. 3A is a top schematic view of a test socket 1 wherein the chip 5 is in positioning status, and FIG. 3B is a cross-sectional schematic view along 3B-3B in FIG. 3A and FIG. 3C is a cross-sectional schematic view along line 3C-3C in FIG. 3A. Referring to FIGS. 3A, 3B and 3C, the chip 5 is received in the recess 2 of the test socket 1 and located at the appropriate position. That is, the chip 5 simultaneously contacts with the first positioning member 131 and the second positioning member 141. Meanwhile, the probes 15 are aligned with the terminals 51 of the chip 5, and thus the probes 15 electrically contact with the terminal 51 of the chip 5.

As shown in FIG. 3B, when the chip 5 is under the positioning process, the pressing device 6 moves downwardly and presses the first protrusion 311 of the first push button 31. Further, when the first protrusion 311 of the first push button 31 is pressed, the first push button 31 moves downwardly and the first wedge surface 315 of the first push button 31 slides downwardly as well. Meanwhile, the first lateral elastic member 34 applies a force to the first abutment end 332 such that the first wedge surface 335 of the first pusher 33 moves toward the recess 2 along the first wedge surface 315 of the first push button 31 and the first pusher 33 moves toward the recess 2, resulting in the first pushing end 331 of the first pusher 33 pushes the chip 5 to laterally slide in the X-direction until the chip 5 contacts with the first positioning member 131 (see FIG. 3A).

Likewise, referring to FIG. 3C, when the pressing device 6 moves downwardly and presses the second protrusion 411 of the second push button 41, the second push button 41 moves downwardly and the second wedge surface 415 of the second push button 41 slides downwardly as well. Meanwhile, the second lateral elastic member 44 applies a force to the second abutment end 432 such that the second wedge surface 435 of the second pusher 43 moves toward the recess 2 along the second wedge surface 415 of the second push button 41 and the second pusher 43 moves toward the recess 2, resulting in the second pushing end 431 of the second pusher 43 pushes the chip 5 to laterally slide in the Y-direction until the chip 5 contacts with the second positioning member 141 (see FIG. 3A).

Given the above, when the pressing device 6 moves downwardly, the pressing device 6 simultaneously presses the first protrusion 311 of the first push mechanism 3 and the second protrusion 411 of the second push mechanism 4. Then the first push mechanism 3 and the second push mechanism 4 will push the chip 5 received in the recess 2 until the chip 5 contacts with the first positioning member 131 and the second positioning member 141. When the chip 5 simultaneously contacts with the first positioning member 131 and the second positioning member 141, the chip 5 is located at the appropriate position and the terminals 51 of the chip 5 align with the probes 15 of the test socket 1 and electrically contact with the probes 15 of the test socket 1.

In addition, the elastic force of the first vertical elastic member 32 is larger than that of the first lateral elastic member 34 and the elastic force of the second vertical elastic member 42 is larger than that of the second lateral elastic member 44. When the pressing device 6 is moved away from the first push mechanism 3 and the second push mechanism 4, the first vertical elastic member 32 will apply a force to the first push button 31 such that the first push button 31 moves upwardly until the first protrusion 311 protrudes from the top of the first section 11 and the first wedge surface 315 of the first push button 31 slides upwardly and the second vertical elastic member 42 will apply a force to the second push button 41 such that the second push button 41 moves upwardly until the second protrusion 411 protrudes from the top of the second section 12 and the second wedge surface 415 of the second push button 41 slides upwardly. Meanwhile, the first pusher 33 is pushed backward by the first push button 31 along the first wedge surface 315 of the first push button 31 and the second pusher 43 is pushed backward by the second push button 41 along the second wedge surface 415 of the second push button 41. Then the first pusher 33 and the second pusher 43 are recovered to be respectively engaged with the first push button 31 and the second push button 41 as shown in FIG. 2B and FIG. 2C respectively.

However, the above embodiments merely describe the principle and effects of the present disclosure, instead of being used to limit the present disclosure. Therefore, persons skilled in the art can make modifications and variations to the above embodiments without departing from the spirit of the present disclosure. The scope of the present disclosure should be defined by the appended claims.

What is claimed is:

1. A test socket for a chip, comprising:
    a recess for receiving the chip, which is surrounded by a first section, a second section, a third section and a fourth section, wherein the first section is connected to the second section and the fourth section and wherein the third section is connected to the second section and the fourth section;
    a first push mechanism arranged at the first section, the first push mechanism comprising:
        a first push button, wherein the first push button has a first protrusion at its top;
        a first vertical elastic member connected to a bottom of the first push button;
        a first pusher cooperated with the first push button, wherein the first pusher has a first pushing end extending into the recess; and
        a first lateral elastic member connected to a first abutment end of the first pusher, wherein the first abutment end is opposite the first pushing end;
        wherein the first vertical elastic member upwardly pushes the first push button such that the first protrusion protrudes from a top surface of the first section and the first push button engages with the first pusher such that the first pusher is not pushed by the first lateral elastic member when no force is applied to the first push button, and wherein the first push button moves downwardly and the first lateral elastic member pushes the first pusher to move toward the recess when the first protrusion of the first push button is pressed;

a second push mechanism arranged at the second section, the second push mechanism comprising:
- a second push button, wherein the second push button has a second protrusion at its top;
- a second vertical elastic member connected to a bottom of the second push button;
- a second pusher cooperated with the second push button, wherein the second pusher has a second pushing end extending into the recess; and
- a second lateral elastic member connected to a second abutment end of the second pusher, wherein the second abutment end is opposite the second pushing end;
- wherein the second vertical elastic member upwardly pushes the second push button such that the second protrusion protrudes from a top surface of the second section and the second push button engages with the second pusher such that the second pusher is not pushed by the second lateral elastic member when no force is applied to the second push button, and wherein the second push button moves downwardly and the second lateral elastic member pushes the second pusher to move toward the recess when the second protrusion of the second push button is pressed.

2. The test socket according to claim 1, wherein the first pusher pushes the chip to move in an X-axis direction, and the second pusher pushes the chip to move in a Y-axis direction.

3. The test socket according to claim 1, wherein the first push button and the first pusher respectively have first wedge surfaces abutted against each other.

4. The test socket according to claim 1, wherein the second push button and the second pusher respectively have second wedge surfaces abutted against each other.

5. The test socket according to claim 1, further comprising a first positioning member arranged within the recess and against the third section and a second positioning member arranged within the recess and against the fourth section, wherein the first pusher and the second pusher push the chip until the chip is in contact with the first positioning member and the second positioning member.

6. The test socket according to claim 1, wherein the first and second vertical elastic members and the first and second lateral elastic member are springs.

7. The test socket according to claim 1, further comprising a pressing device, wherein the pressing device is substantially arranged above the test socket and used for driving the first push mechanism and the second push mechanism.

8. The test socket according to claim 1, wherein an elastic force of the first vertical elastic member is larger than an elastic force of the first lateral elastic member, and wherein an elastic force of the second vertical elastic member is larger than an elastic force of the second lateral elastic member.

9. A test socket for a chip, comprising:
- a recess for receiving the chip, which is surrounded by four sections;
- two push mechanisms respectively arranged at two adjacent sections, each of the two push mechanisms comprising:
  - a push button, wherein a bottom of the push button is connected to a vertical elastic member;
  - a pusher which is cooperated with the push button, wherein one end of the pusher extends into the recess and the opposite end of the pusher is connected to a lateral elastic member;
  - wherein a top of the push button protrudes from a top surface of the section and the pusher is engaged with the push button when the push button is upwardly pushed by the vertical elastic member, and
  - wherein the lateral elastic member pushes the pusher to move toward the recess when the push button is pressed and moves downwardly.

10. The test socket according to claim 9, wherein the pushers push the chip to respectively move in an X-axis direction and a Y-axis direction.

11. The test socket according to claim 9, wherein the push button and the pusher respectively have wedge surfaces abutted against each other.

12. The test socket according to claim 9, further comprising two positioning members respectively arranged at different but adjacent two sections, wherein the pushers push the chip until the chip is in contact with the two positioning members.

13. The test socket according to claim 9, wherein the vertical elastic members and the lateral elastic member are springs.

14. The test socket according to claim 9, further comprising a pressing device, wherein the pressing device is substantially arranged above the test socket and configured for driving the two push mechanisms.

15. The test socket according to claim 9, wherein an elastic force of the vertical elastic member is larger than an elastic force of the lateral elastic member.

* * * * *